United States Patent [19]

Baldwin et al.

[11] Patent Number: 4,639,619

[45] Date of Patent: Jan. 27, 1987

[54] ELECTRONIC SAMPLER SWITCH

[75] Inventors: Gary Baldwin, Palo Alto, Calif.;
Robert B. Hallgren, Ithica, N.Y.;
Thomas Hornak, Portola Valley,
Calif.; Fred H. Ives, Veradale, Wash.

[73] Assignee: Hewlett-Packard Company, Palo Alto, Calif.

[21] Appl. No.: 799,887

[22] Filed: Nov. 20, 1985

[51] Int. Cl.$^4$ .................. H03K 17/14; H03K 17/16; H03K 17/687
[52] U.S. Cl. .................. 307/352; 307/572; 307/577
[58] Field of Search .............. 307/352, 571, 572, 577, 307/584

[56] References Cited

U.S. PATENT DOCUMENTS 4,308,468 12/1981 Olson .................. 307/572
4,323,796 4/1982 Lathrope .................. 307/572

Primary Examiner—John Zazworsky
Attorney, Agent, or Firm—Leslie G. Murray

[57] ABSTRACT

A low distortion differential sampler circuit implemented in GaAs is provided. The sampler circuit constitutes an on/off switching circuit rather than a sample and hold circuit. Elimination of the holding capacitor results in shorter switching times and reduced error. The sampler implements a differential, balanced architecture which compensates for clock signal feed through. The sampler circuit includes a three-stage, AC coupled GaAs pre-amplifier which provides a complementary clock signal to drive the sampler and sets the DC levels.

8 Claims, 8 Drawing Figures

ELECTRONIC SAMPLER SWITCH

BACKGROUND OF THE INVENTION

The present invention relates generally to digital-to-analog converters (DACs) and particularly to current switching DACs having a sampled output.

A DAC consists essentially of a set of analog current-steering switches each controlled by one of the DAC's digital inputs. In an n-bit current switching DAC the digital input is an n-bit binary number, or word, and each bit has a corresponding weighted current. The weighted currents $I_1 \ldots, I_n$ are related by $I_k = 2^{k-1}I$, where k is an integer in the range of $1 \leq k \leq n$, where the $k^{th}$ weighted current corresponds to the $k^{th}$ bit of the n-bit binary word and where k=1 corresponds to the least significant bit. For each bit which is equal to "1" a corresponding weighted current is coupled to the output of the DAC and for each bit which is equal to "0" a corresponding weighted current is not coupled to the output of the DAC. In this manner the current at the output of the DAC is the sum of the individual weighted currents coupled to the output of the DAC and the magnitude is proportional to the n-bit word input to the DAC.

All DACs have an inherent limitation that may cause troublesome transients or glitches to be superimposed on the DAC output signal. When a new input word is applied to the DAC input to replace the previous word, proper operation of the DAC requires a simultaneous change of logic states on all digital inputs. In practical digital systems, however, the arrival of logic signals at the DAC inputs will always be somewhat skewed, mainly due to non-uniform delays in the individual logic signal source circuitry and interconnecting wiring. Further, individual switch cells may turn on faster than other switch cells, turn on faster than off or off faster than on, or in some cases a mixture of both. During the time when logic inputs are changing (skew time), the analog portion of the DAC will produce a glitch.

The glitch will be most severe at the time of the major carry—when all logic inuts are changing. For a DAC the single-count transition between 011 . . . 111 and 100 . . . 000 could produce an intermediate logic state (e.g., the worst case) of 000 . . . 000 or 111 . . . 111 during the skew interval. This momentary logic input will force the analog output of the DAC to slew towards either voltage extreme for the duration of the skew time. The higher the rate of succession of digital words (i.e., the shorter the duration of each word at the DAC's input) the more significant the glitch becomes.

This skew time (caused by unequal turn-on/off times and bit transmission delays) can be minimized if all logic bits are loaded into a clocked storage register before transfer to the DAC. The simultaneous transfer of all bits into the DAC will limit skew times to those of the register and the DAC switches. typically the register consists of a set of latches or master-slave flip-flops inserted between the digital inputs and the analog switches and is usually located in the immediate physical vicinity of the analog switches, preferably on the same monolithic chip. The DAC digital data inputs drive the data inputs of the master-slave flip-flops and the flip-flop outputs in turn drive the analog switches. The clock inputs of the flip-flops are all driven by a common clock signal whose phase is chosen so that its positive transition occurs prior to the most advanced data transition (the master-slave flip-flops are assumed to be positive-edge-triggered). The positive transition in the clock signal results in a transition in the flip-flop output signals which updates the output signals to become copies of the flip-flop input data. Because the flip-flops are all clocked by a common clock signal, the inputs to the analog switches occur simultaneously with negligible skew between the inputs and the DAC's output current controlled by the analog switches changes smoothly from a value representing one digital word to a value representing the next digital word.

However, this method of glitch removal has a drawback which may largely defeat the original purpose of the flip-flops, i.e., the removal of unwanted glitches from the DAC output signal. Since the flip-flops are positive-edge-triggered, the negative going edge of the clock represents an unavoidable "unused" transition of the clock signal. Due to the finite switching speeds of the flip-flops this unused clock transition cannot be moved arbitrarily close to the active transitions, but must occur somewhere near the center of the word interval, i.e., in the center of the interval between two active transitions. Consequently the unused clock transition will occur after the analog switch has settled and the DAC output current is being utilized. Due to crosstalk between the flip-flops and the analog switches and elsewhere on the chip, the unused clock transition will cause a disturbance (glitch) in the DAC output (analog output).

An additional spike or glitch may be generated in the DAC output when the DAC input changes state causing an internal switching in the DAC. The internal switching creates a transient overshoot or undershoot at the leading or trailing edge of an output transient. The amplitude of the glitch can be significant when compared to the size of a step being made. For low bandwidth (slow) systems the time that the glitch exist may be very short compared to the total duration of the step and conventional low pass filtering may be utilized to satisfactorily remove the glitches. In high bandwidth (fast) systems, where the glitch may comprise a significant portion of the step duration, other means must be employed to eliminate the glitch. One such means comprises a sample and hold circuit in which the output of the DAC is sampled just prior to the end of the word interval, when the output has stabilized, and this value held during the glitch of the next step. A new sample is then taken after the DAC output has settled to the new value in the next word interval.

Use of sample and hold systems may present several significant drawbacks. One limitation in a sample and hold system is the minimum acquisition time (i.e., the time required for the previous value to become the new value). The time to switch from sample to hold must be fast enough to decouple the sample and hold circuit from the following glitch. The decay rate of the storage element, typically a capacitor, during the hold period must be small enough to produce negligible error. Further, feedthrough from the sample switch to the stroage element may generate spiking much larger than the size of the steps in the DAC output thereby defeating the purpose of the sample and hold circuit.

SUMMARY OF THE INVENTION

In accordance with the principles of the present invention, a high speed monolithic current switching digital to analog converter (DAC) is provided. The DAC integrated circuit (IC) comprises input ECL to MOS level shift clock and data converters, clock drivers, differential dual latch multiplexer data latches and high speed current switching cells. The DAC IC is designed for use in a 12-bit sampled DAC system which includes an NMOS buffer IC, external precision current sources and a gallium-arsenide (GaAs) sampler IC. The DAC system operates at a 134 Mword/second data rate providing an analog output with a spurious content of less than −65 dB and which settles to ½ least significant bit (LSB) in less than 4 ns.

The DAC IC performs data synchronization and high speed current steering of binary weighted precision currents to a pair of differential output summing rails called RAIL and RAILBAR. The current switching cells utilize supplementary weighted currents to overcome the effects of long settling times due to parasitic capacitances as disclosed in U.S. Pat. No. 4,405,916 issued to Thomas Hornak and Gary L. Baldwin on Sept. 20, 1983, which is incorporated herein by reference. The data driver accepts ECL level data and provides complementary (i.e., 180° out of phase) MOS level data inputs to dual differential latches. The output of the dual latches is coupled to a differential multiplexer which selects the data to be coupled to the differential current switching cells. The dual latches and multiplexers require complementary clocks at one-half the data rate. Thus, effectively, data is latched at each transition or edge of the clock pulse rather than at only the positive (or negative) going edge of the clock as in prior art systems. This eliminates feedthrough of the previously unused clock edge and hence any perturbation in the DAC as is seen in the prior art.

The DAC utilizes an external current source to establish the required precision weighted currents at the DAC output. The buffer IC provides additional isolation between the precision current source and the DAC IC current switching cells to achieve fast switching in the digital to analog conversion process. This buffers the impedance of the current source and decreases the capacitance seen by the DAC IC thereby decreasing the DAC settling time and increasing DAC speed.

The sampler IC comprises a low distortion differential GaAs sampler to sample the output of the DAC to remove any spurious signals or noise that may be present in the DAC output due to the DAC's nonlinear slewing and settling. The sampling switch is an on/off switch, rather than a sample and hold circuit. The sample switch has no holding capacitor to charge resulting in faster on/off switching and less error. Further, there is no error introduced by capacitor discharge between samples. The sampler is operated at the data rate. The sampler IC includes a three-stage, ac coupled GaAs pre-amp which decreases the data clock pulse rise/fall time (hence increasing the slew rate) from approximately 1 ns to 200 ps and provides complementary outputs to a dc coupled level shift buffer stage which drives the sampler. The sampler is a differential, triple balanced architecture which steers the DAC's two outputs—RAIL and RAILBAR—alternately to a load resistor via a balancing transformer (balun) and to ground (or to a power supply return line via a dummy load resistor).

The three ICs making up the DAC system are mounted in an 89 pin, pin grid array multilayer ceramic package. The GaAs sampler IC mounts to the ceramic package floor, and a heat sink covers the back side of the package base. The package base acts as a multilayer RF substrate connecting the sampler IC, DAC IC and supporting components such as the NMOS buffer IC, chip resistors and chip capacitors.

DESCRIPTION OF THE PREFERRED EMBODIMENT

Figure 1:
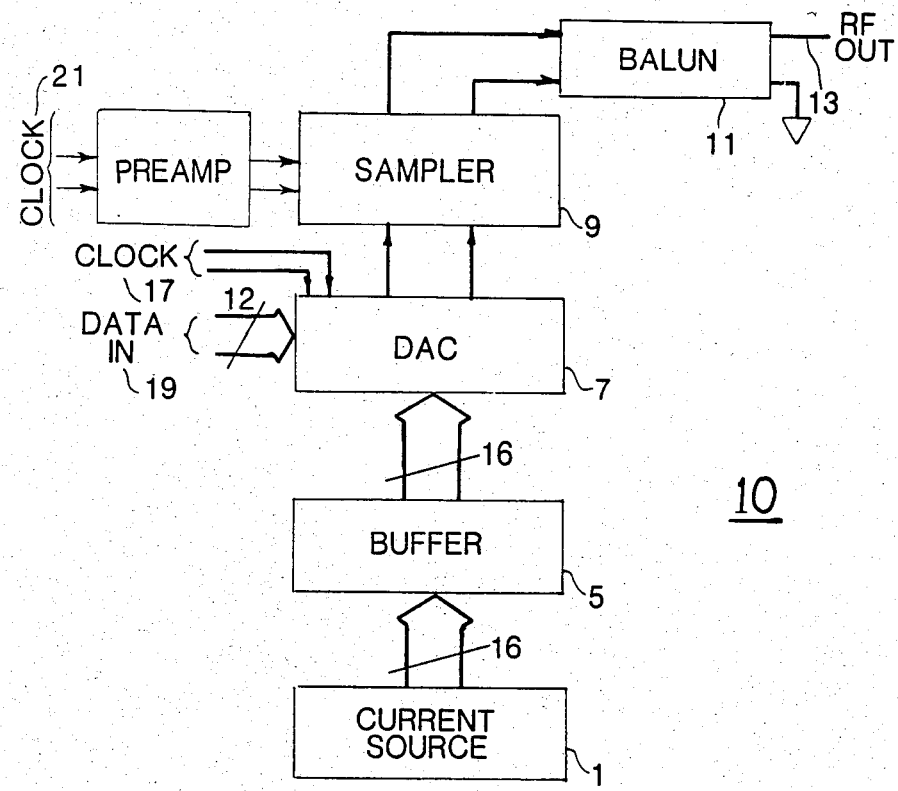
FIG. 1 is a block diagram of a digitial-to-analog converter system according to the principles of the present invention.

Referring now to FIG. 1, a digital-to-analog conversion system (DAC) 10 according to the principles of the present invention is ilustrated. The DAC 10 comprises a monolithic NMOSFET current switching DAC IC 7, an NMOSFET buffer IC 5 and a gallium arsenide (GaAs) sampler IC 9 mounted in a multilayer, co-fired ceramic package. Clock driver preamp 15 provides the clock signal for sampler 9. The circuitry for the sampler clock driver preamp 15 is included on the sampler IC 9 chip. Included in the DAC 10 is a precision current source 1 and an output balun 11; the balun 11 provides a single-ended ac output on line 13 from the complementary differential outputs of the sampler 9. The data in 19 comprises ECL level, single ended 12-bit words. Latch clock 17 inputs a complementary ECL clock at one-half the frequency of the rate of input data. The sampler clock 21 is a complementary ECL signal at the same rate as the data clock.

Figure 2:
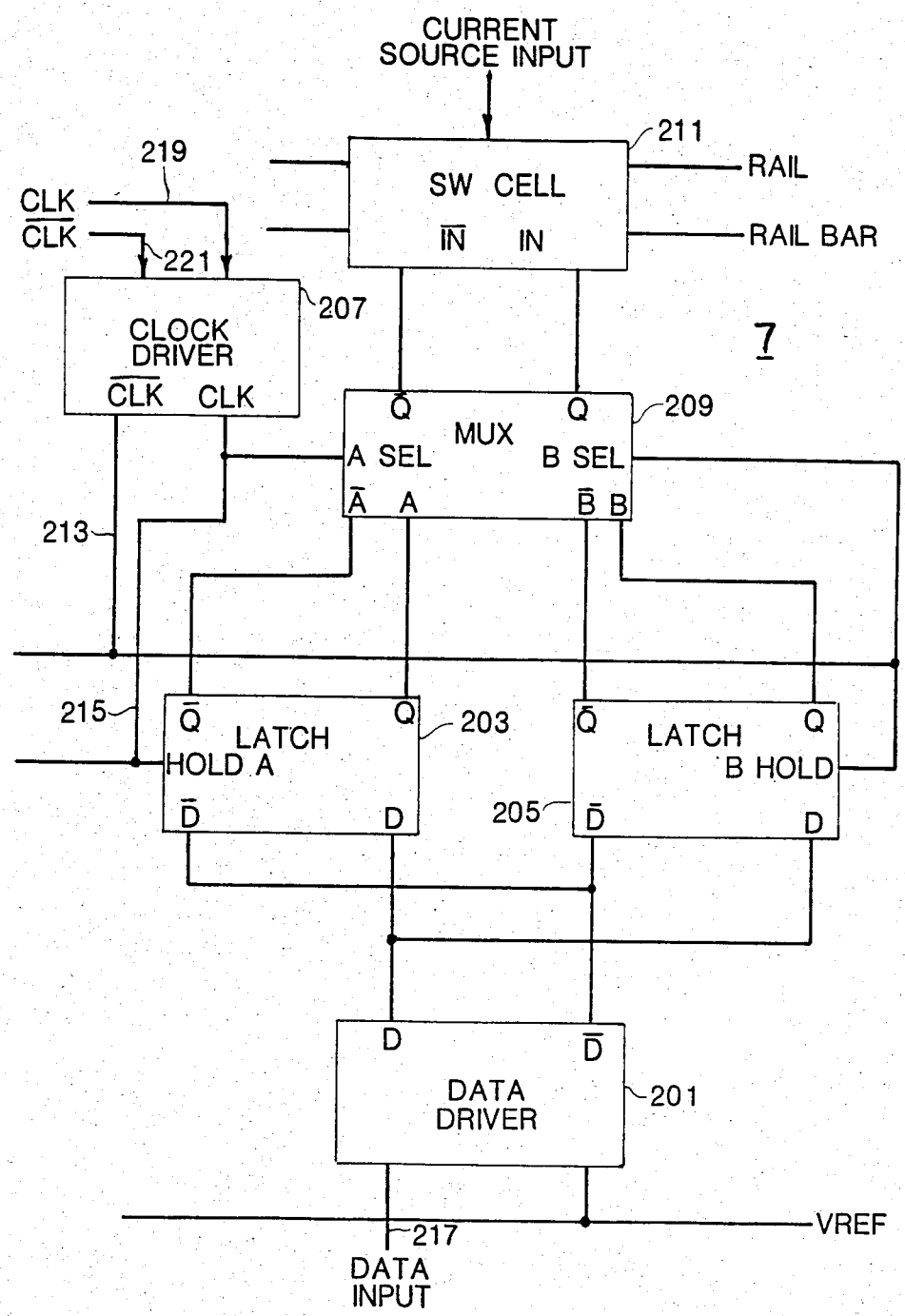
FIG. 2 is a functional block diagram illustrating the architecture of one of the twelve cells of the DAC IC shown in FIG. 1.

Referring now to FIG. 2, a functional block diagram of the DAC IC 7 for a single bit is illustrated. The DAC IC 7 comprises a set of 12 such circuits or cells plus associated circuitry (not shown) to provide dynamic biasing. One clock driver 207 provides the latch clock signal to all 12 cells. The data driver 201 accepts a single-ended ECL data bit input on line 217 which is converted to complementary MS level outputs to drive the dual data latches 203 and 205. The clock driver 207 accepts complementary ECL latch clock inputs, CLK and CLKBAR on lines 219 and 221 respectively, at one-half the data rate and provides complementary MOS latch clock outputs, CLK and CLKBAR on lines 215 and 213 respectively, to the data latches 203 and 205 and the multiplexer 209. The input data is latched into latch A 203 on the rising edge of the latch clock (CLK output on line 215 from clock driver 207) and is latched into latch B on the falling edge of the latch clock (rising edge of CLKBAR output on line 213 from clock driver 207). The output of latch A 203 is coupled to the A input port of multiplexer 209 and the output of latch B 205 is coupled to the B input port of multiplexer 209. The multiplexer 209 selects which latch outputs will drive the switch cell 211. The multiplexer 209 inputs A SEL and B SEL are clocked by the same clock driver 207 output, CLK and CLKBAR, which clocks latch A 203 and latch B 205, respectively. After the rising edge of CLK, latch A 203 is holding data and the multiplexer 209 selects the latch A 203 output; after the falling edge of CLK (the rising edge of CLKBAR), latch B 205 is holding data and the multiplexer 209 selects the latch B 205 output. When the latch clock changes state at either edge, the latch that was holding data becomes transparent and the latch that was transparent latches the data set-up at its inputs. The multiplexer "reads" the output of each latch only after that output is holding a steady state value; at the same time, it blocks the output of the opposite latch. The clock feedthrough of the prior art associated with the previously "unused" falling edge of the latch clock will not occur in the multiplexer 209 outputs driving the precision current switch cell 211. The operation of the switch cell 211 is described in the aforementioned U.S. Pat. No. 4,405,916 and will not be described here. The output of the DAC IC 7 on RAIL and RAILBAR (as shown in FIG. 2) is dc coupled to a high speed monolithic GaAs current steering sampler 9 (as shown in FIG. 1).

Figure 3A:
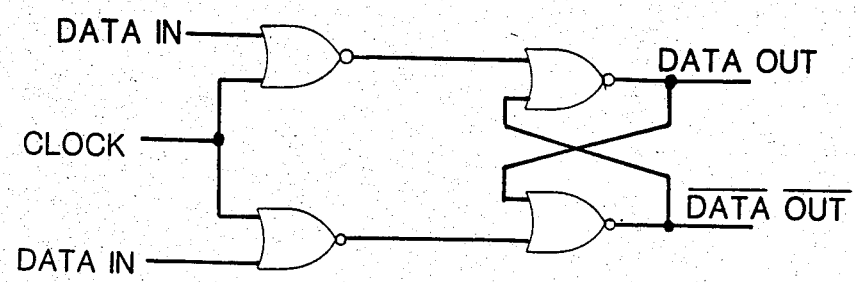
FIGS. 3A and 3B illustrate logic diagrams for a conventional NOR latch and a NOR data multiplexer.
Figure 3B:
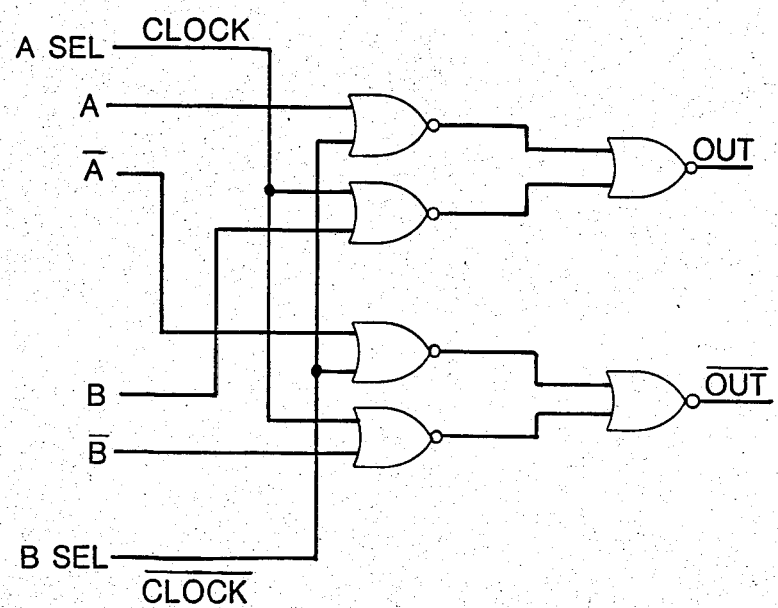

NOR transport latch and NOR multiplexer configurations illustrated in FIGS. 3A and 3B respectively are utilized in the DAC IC 7. Complementary NOR logic was chosen in order to maximize logic symmetry and minimize glitches. Typically, complementary logic tends to produce lower amplitude glitches of shorter duration than single-ended logic and minimizes coupling to the outputs.

The sampler 9 (as shown in FIG. 1) comprises a current steering differential switch which is on the same monolithic chip as the sampler clock driver preamp 15. Also included on the same chip are resistive biasing for the ac coupled preamp 15 and thirty-one diodes to provide static and dynamic protection for the GaAs circuitry. The diodes (as shown in FIGS. 4 and 5) clamp chip inputs to prevent turn on transients and excursions in power supplies and other external circuitry from damaging the on-chip devices.

Figure 4:
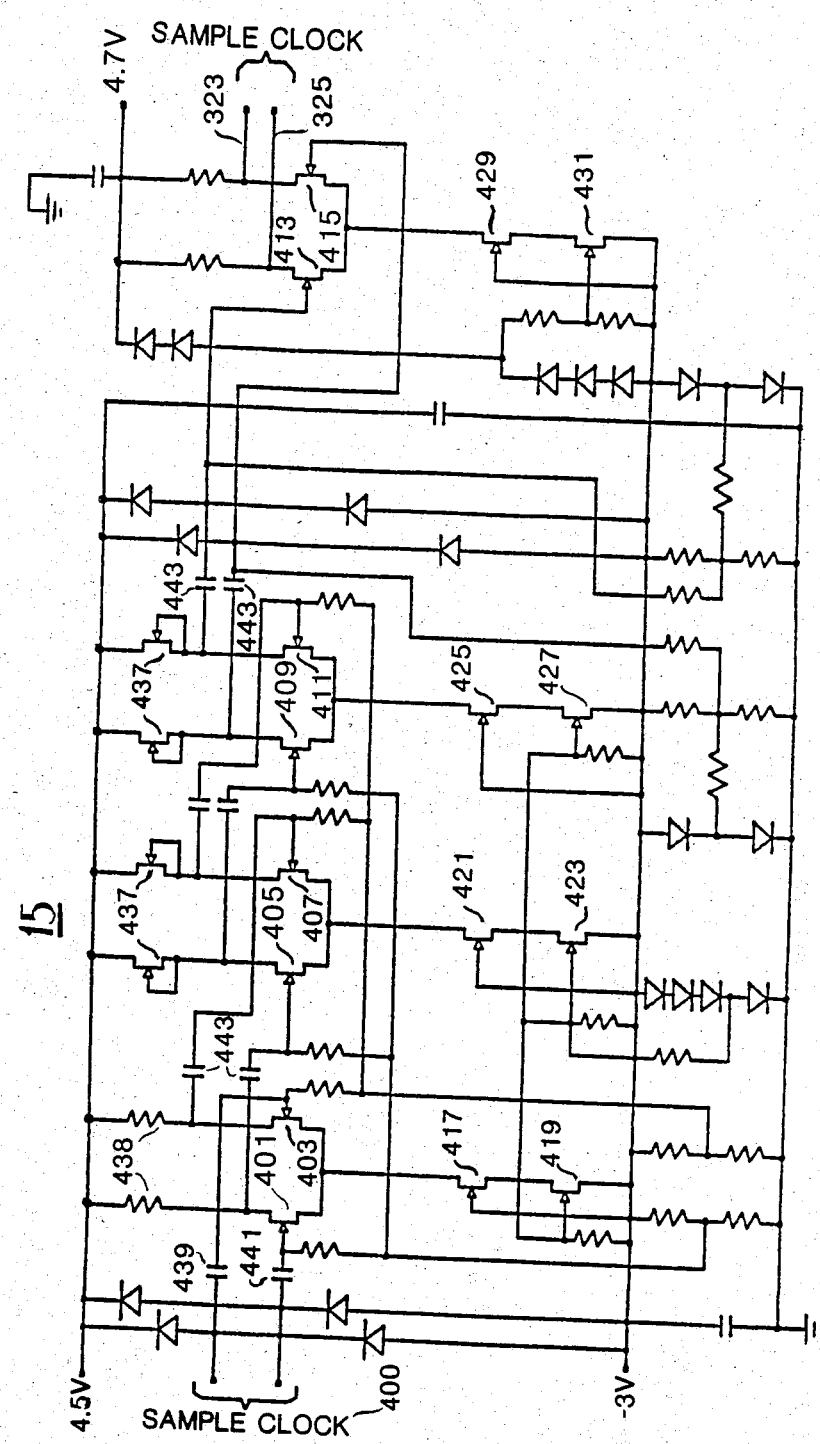
FIG. 4 is a schematic diagram of the GaAs clock driver preamp shown in FIG. 1.
Figure 5:
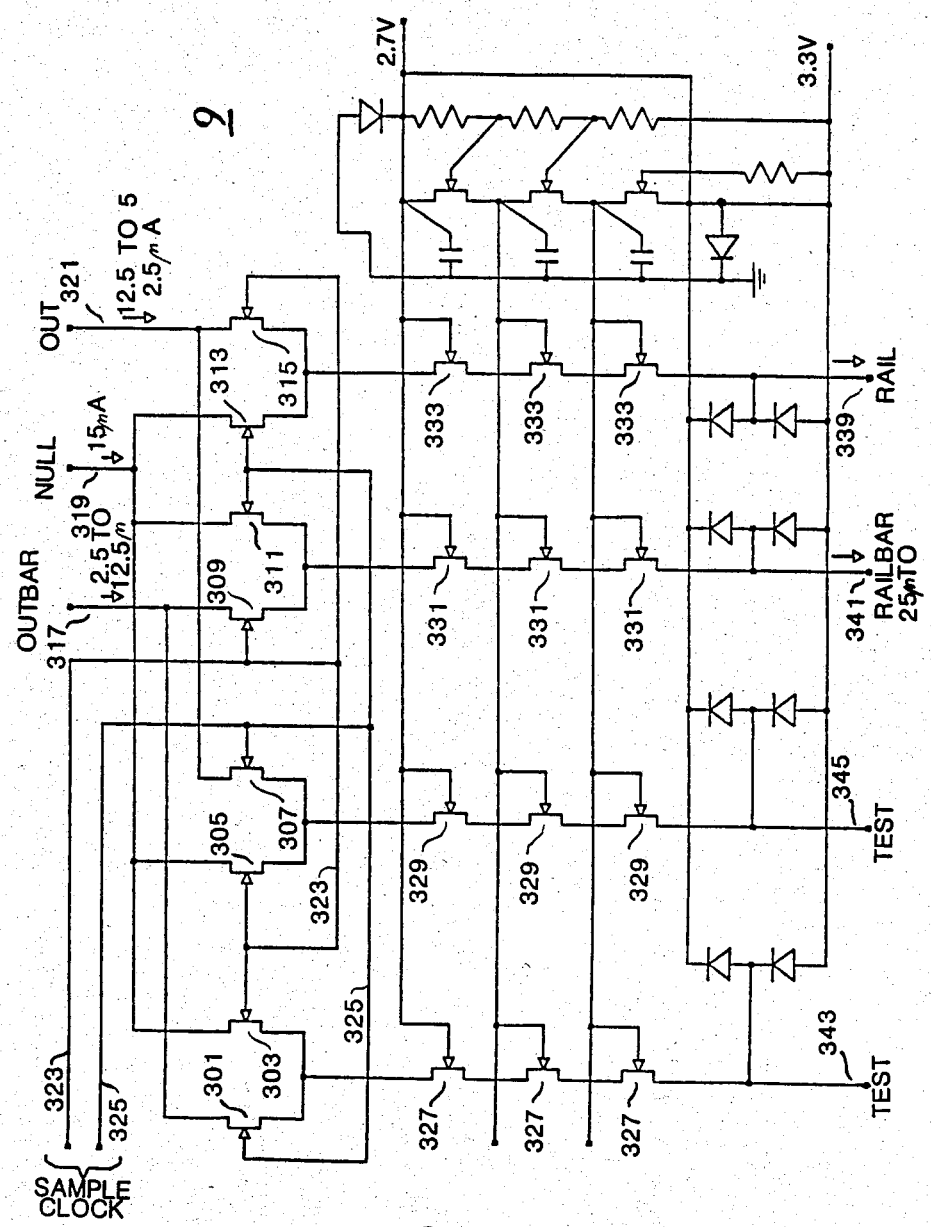
FIG. 5 is a schematic diagram of the GaAs differential sampler circuit shown in FIG. 1.

Referring now to FIG. 4, the clock driver preamp 15 comprises a three-stage differential, ac coupled GaAs preamp, a dc level shift buffer and turn on protection circuitry. The preamp decreases the rise and fall time of the clock signal from approximately 1 ns to 200 ps, and the dc level shift buffer sets the clock signal voltage swing to the appropriate levels for the sampler circuit.

The sampler clock input 400 is coupled via capacitors 439 and 441 to the gates of GaAs FETs 401 and 403 which are connected to form a first common source differential amplifier stage with load resistors 438. FETs 405, 407 and 409, 411 form the second and third stages of the three-stage preamp. FETs 437 in the drain circuit of the second and third stages serve as resistive loads for the stages. FETs 417, 419, 421, 423 and 425, 427 buffer and isolate the common source circuits of each stage. Each stage is ac coupled to the next stage by coupling capacitors 443. The output of the third stage 409, 411 is ac coupled to the level shift buffer 413, 415.

The level shift buffer 413, 415 input is a complementary clock signal at −1 volt dc bias. The output of the level shift buffer 413, 415 on lines 323 and 325, is a complementary clock signal with a four volt swing from 0.7 volt to 4.7 volt and rise and fall times of 200 ps. The output is dc coupled on lines 323 and 325 to the differential sampling switch (as shown in FIG. 5). The buffer stage utilizes resistive loads in the drain circuit for minimum output offset to provide well-balanced complementary outputs. The gate dimensions of FETs 413 and 415 are matched with the resistive loads to provide optimum turn on time for the triple balanced sampling switch 9 (as shown in FIG. 1).

Referring now to FIG. 5, the current steering sampler switch 9 is made up of twenty 235 micron gate GaAs FETs and provides a true on/off switch rather than a sample and hold circuit. The sampler switch 9 is balanced to a differential input, RAIL and RAILBAR, balanced differential output, OUT and OUTBAR, and balanced to the complementary sampler clock or control signal on lines 323 and 325. This provides a linear output signal with maximum rejection of sampler clock feedthrough and all non-linear components at least 68 dBc down.

FETs 313 and 315 form a common source differential switch which switches the RAIL, line 339, input between OUT, line 321, and a "throwaway" NULL or ground (power supply return) line, line 319. Similarly, FETs 309 and 311 form a second differential switch which switches the RAILBAR, line 341, input between OUTBAR, line 317, and the "throwaway" NULL or ground (power supply return) line, line 319. The complementary sampler clock is dc coupled on lines 323 and 325 to the FET gates. When the clock signal on line 323 goes high, the clock on line 325 goes low insuring that when FETs 309 and 315 are on, FETs 311 and 313 are off. FETs 331 and 333 in the common source circuits of FETs 309, 311 and 313, 315, respectively, isolate the switches from common drain node (RAIL and RAILBAR in the DAC, as shown in FIG. 2) capacitance to reduce switching time of the switches.

FETs 301, 303 and 305, 307 comprise a second set of "nonswitching" switches which function to reduce spurious feedthrough of the sample clock due to the gate-drain capacitance of the FETs. A rising clock voltage on line 323 turns on FET 315 and couples a pulse of current via the gate-drain capacitance of FET 315 into the OUT, line 321, node. At the same time the complementary clock on line 325 provides a falling voltage at the gate of FET 307 which couples a balancing pulse of current via the gate-drain capacitance of FET 307 out of the OUT, line 321, node. Similarly, the gate-drain capacitance of FET 301 compensates the gate-drain capacitance of FET 309 and the gate-drain capacitances of FETs 303 and 305 compensate for the gate-drain capacitances of FETs 311 and 313. The "non-switching" switches balance the effects of sampler clock feedthrough in the "switching" switches to provide a sampler that is not drive level, voltage level or delay sensitive. In this embodiment, the test leads 343 and 345 and left unconnected and allowed to float.

The outputs of the sampler switch 9 are coupled to a balun 11 (as shown in FIG. 1) wherein the complementary ac outputs are subtracted. The balun provides a single-ended output with excellent linearity and low spurious signal content. The balun also rejects other undesirable system noise.

Figure 6:
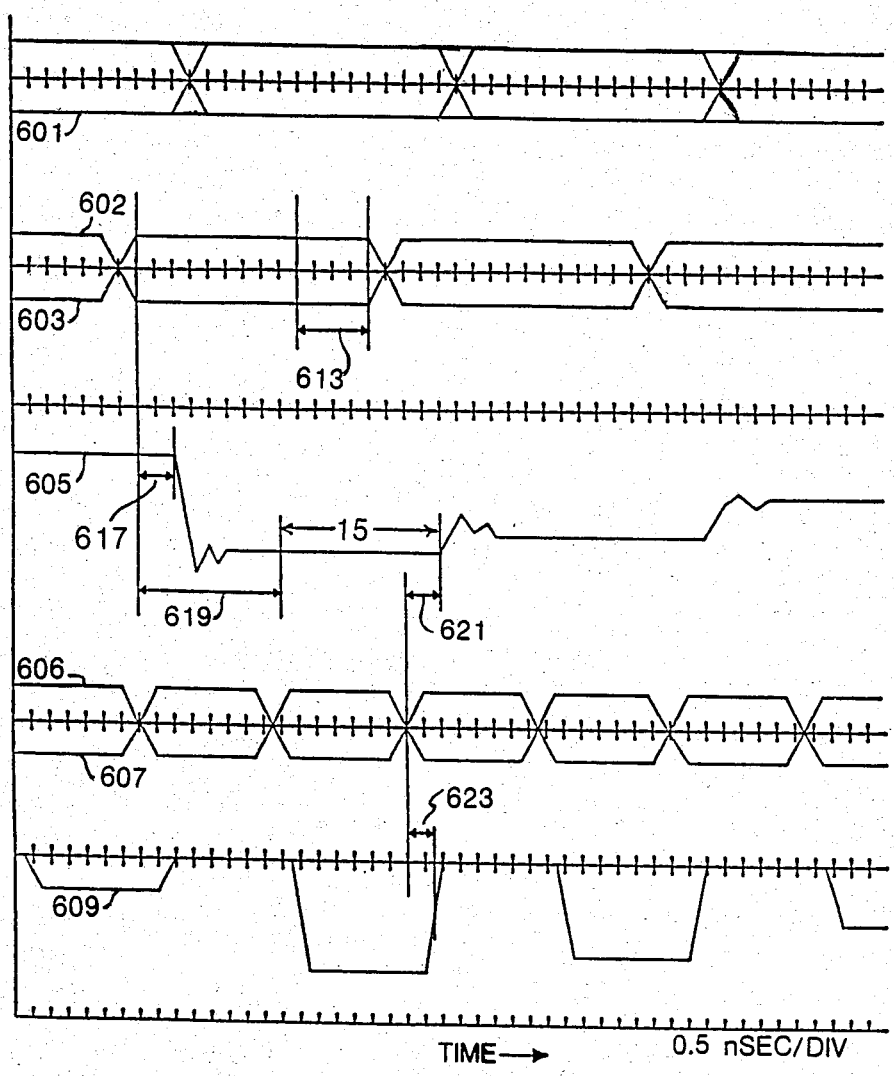
FIG. 6 is a timing diagram for the DAC system shown in FIG. 1.

Referring now to FIGS. 2 and 6, waveform 601 is the data input to the DAC data driver 201 (as shown in FIG. 2) and waveforms 602 and 603 are the clock and clockbar, respectively, inputs to clock driver 207 (i.e., the DAC clock). The data registers 203 and 205 function as ordinary positive edge triggered latches. Since complementary (180 degrees out of phase) clocks 602 and 603 at one-half the data rate are utilized to trigger the dual latches, 203 and 205, data is effectively latched on both the positive and the negative edge of the clock.

Data is allowed to change immediately after any clock transition (i.e., zero hold time), but all data must be valid for at least 2 ns prior to the next clock edge for data to be latched (2 ns set-up time 613). The delay 617 from clock edge to DAC output transitions in 2 ns maximum and the DAC output 605 is valid and settled to within onehalf LSB of the final value within 4 ns 619 maximum after transition of the clock, clockbar edge. By delaying (or advancing) the clock signals 602 and 603, differences in the electrical paths between the data 601 and the clock 602, 603 can be compensated for to achieve maximum performance of the DAC. The ECL input complementary clocks are buffered to MOS logic levels in the clock driver 207. The clock driver 207 consists of four dc coupled gain stages with a slew capability of 5 volts within 1 ns.

The sampler clock driver preamp 15 (as shown in FIG. 1) provides complementary clocks 606 an 607 of the proper voltage swing and slew rate (on lines 323 and 325 as shown in FIG. 5) from the ECL sample clock 400 (as shown in FIG. 4). The sampled portion 615 of the DAC output 605 is substantially free of glitches generated within the DAC IC 7. The sampler hold time 621 is nominally 0.75 ns and a maximum of 1.25 ns. The sampler delay 623 from a sampler clock edge to sampler output is nominally 1.0 ns and 1.25 ns maximum. The output of the sampler is illustrated as waveform 609.

Figure 7:
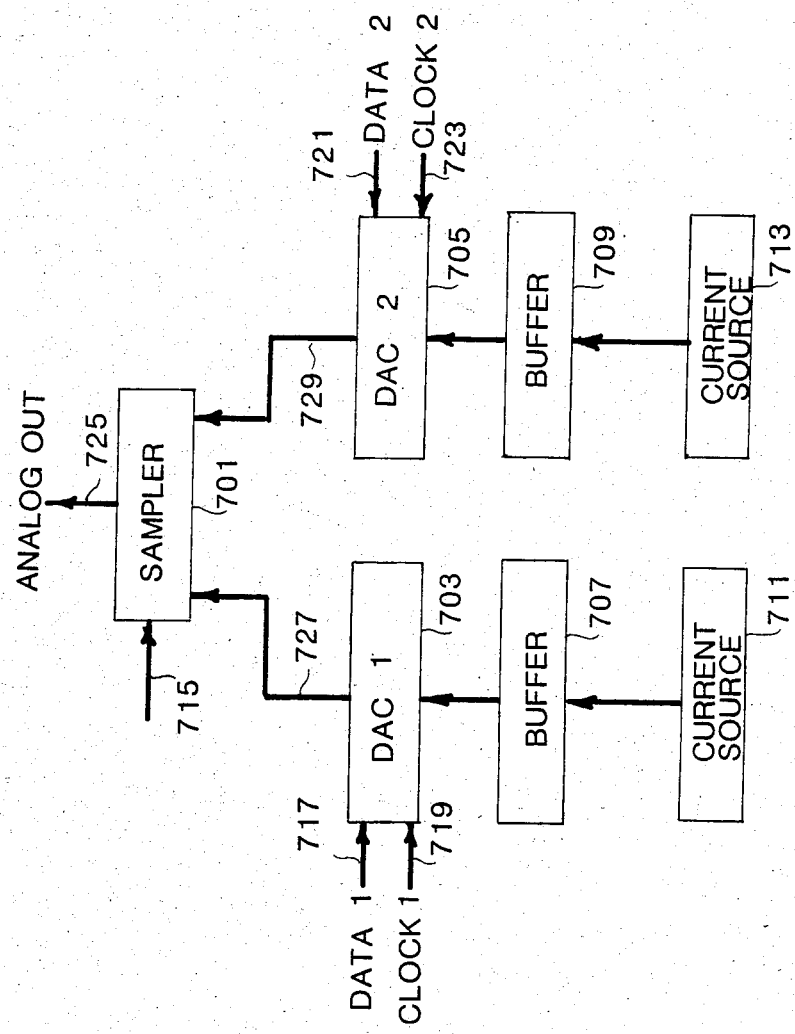
FIG. 7 is a block diagram of a multiplexed dual digital-to-analog converter system according to the principles of the present invention.

In another embodiment, two or more DACs may be coupled to a multiplexing sampler switch to form a push-pull system or to increase the sampling and data rates. Referring now to FIG. 7, two identical DAC systems, DAC 1 703, buffer 707 and current source 711 and DAC 2 705, buffer 709 and current source 713 are coupled to the sampler 701. DAC 1 703 and DAC 2 705 each has its own clock and data inputs, CLOCK 1 on line 719 and DATA 1 on line 717 and CLOCK 2 on line 723 and DATA 2 on line 721, respectively. In the described embodiment DAC 1 703 and DAC 2 705 are current switching DACs having an architecture similar to that of the DAC system described herein above; however, other DAC architectures may be utilized to form a similar multiplexed DAC system.

Referring now to FIGS. 5 and 7, the sampler 9 (as shown in FIGS. 1 and 5) may be utilized in the dual DAC system illustrated in FIG. 7 as the multiplexing sampler switch 701. DAC 1 and DAC 2, 703 and 705, have differential outputs RAIL and RAILBAR (as shown in FIG. 2) represented by lines 727 and 729, respectively. One of the DACs, DAC 2 705, for example, is connected to the RAIL 339 and RAILBAR 341 inputs of the sampler switch 9. The other DAC, DAC 1 703 in this example, is connected to the test leads 343 an 345. FET switches 301, 303, 305 and 307 are connected to the complementary sample clocks on lines 323 and 325 180 degrees out of phase with FET switches 309, 311, 313 and 315, respectively (as shown in FIG. 5). For example, when the sample clock on line 325 is going positive, FET 301 is turned on directing the weighted current on test lead 343 to OUTBAR on line 317 and FET 311 is turned on directing any current on RAILBAR line 341 to the throwaway NULL on line 319. Since the sample clock on line 323 is 180 degrees out of phase with the sample clock on line 325, FETs 303 and 309 are turned off. FET switches 305 and 313 and 307 and 315 function similarly. In the above described manner, the outputs of the two DACs 703 and 705 are multiplexed on to the output, OUT on line 321 and OUTBAR on line 317, of the sampler 9 while the mutual compensation of the gate-drain capacitances, described hereinbefore, is maintained. In similar fashion, additional DACs may be multiplexed to provide increased sampling rates and data rates.

We claim:

1. An electronic sampler switch comprising:
   a first switch having a switch input, a control input and a switch output, said first switch responsive to a control signal applied to the control input for coupling an input current applied at the switch input to the switch output when said control signal is of a first value and for coupling said input current away from the switch output when said control signal is of a second value; and
   a second switch coupled to the switch output, said second switch responsive to said control signal for subtracting from the switch output a current sufficient to canel any current coupled to the switch output by said control signal from effects of interelectrode capacitance between the first switch control input and the switch output such that the total current at the switch output is equal to said input current when said control signal is of said first value and is zero when said control signal is of said second value.

2. An electronic sampler switch as in claim 1 wherein said first switch comprises:
   a first transistor coupling the switch input to the switch output, said first transistor responsive to said control signal to couple said input current to the switch output when said control signal is of said first value; and
   a second transistor coupled to the switch input and to ground, said second transistor responsive to said control signal to couple said input current to ground when said control signal is of the second value.

3. An electronic sampler switch as in claim 2 wherein said control signal comprises a pair of complementary clock signals, said signals being 180 degrees out of phase.

4. An electronic sampler switch as in claim 3 wherein said first switch further comprises buffer means coupling said switch input to said first and second transistors for buffering said first switch from effects of input parasitic capacitances to decrease switching time of said first switch.

5. An electronic sampler switch as in claim 4 wherein said first and second transistors comprise FET's, the source of the first FET and of the second FET connected together at a common connection coupled to said switch input, and a first of said pair of clock signals coupled to the gate of the first FET and a second of said pair of clock signals coupled to the gate of the second FET, the first and second FETs responsive to said control signal such that when said first clock signal is of said first value and said second clock signal is of said second value, the first FET is conducting and the second FET is not conducting.

6. An electronic sampler switch as in claim 5 wherein said buffer means comprise a plurality of FETs, connected in series, coupling the switch input to the common connection.

7. An electronic sampler switch as in claim 6 wherein said FETs are scaled to the magnitude of the total input current.

8. An electronic sampler switch as in claim 7 wherein said FETs comprise gallium arsenide FETs.

* * * * *